United States Patent [19]
Delfino et al.

[11] Patent Number: 5,627,105
[45] Date of Patent: May 6, 1997

[54] PLASMA ETCH PROCESS AND TISI$_x$ LAYERS MADE USING THE PROCESS

[75] Inventors: Michelangelo Delfino; Mary E. Day, both of Los Altos; Wilman Tsai, Cupertino, all of Calif.

[73] Assignee: Varian Associates, Inc., Palto Alto, Calif.

[21] Appl. No.: 44,869

[22] Filed: Apr. 8, 1993

[51] Int. Cl.$^6$ .................................................. H01L 21/44
[52] U.S. Cl. ................... 438/627; 257/751; 257/757; 257/758; 438/664; 438/643; 438/974
[58] Field of Search .................................. 437/200, 946; 148/DIG. 17, DIG. 158; 257/765, 768, 757

[56] References Cited

U.S. PATENT DOCUMENTS

| | | | |
|---|---|---|---|
| 4,540,607 | 9/1985 | Tsao | 427/253 |
| 4,579,609 | 4/1986 | Reif et al. | 437/170 |
| 5,168,071 | 12/1992 | Fullowan et al. | 437/31 |
| 5,250,467 | 10/1993 | Somekh et al. | 437/192 |
| 5,317,187 | 5/1994 | Hindmann et al. | |

OTHER PUBLICATIONS

Plasma Characteristization of an electron ccyclotron resonance – radio frequency hybred plasma reactor, Y.H. Lee et al., *J. Vac. Sci, Technology* A7(3), May/Jun. 1989, pp. 903 – 907.

Plasma Charcterization for a divert field electron cyclotron resonance source, J. Forster et al., *J. Vac. Sci. Technology* A7(3), May/Jun. 1989, pp. 899 – 902.

Characteristics of electron. cyclotron resonance plasma sources, O. A. Popov, *J. Vac. Sci. Technology* A7(3), May/Jun. 1989, pp. 894 – 898.

Article by D. Pramanik, A.N. Saxena, O.K. Wu, G.G. Peterson and M. Tanielian, entitled "Influence of the interfacial oxide on titanium silicide formation by rapid thermal annealing", published in *J. Vac. Sci. Technol.* B2 (4) Oct.–Dec. 1984, pp. 775–780.

Article by D.W. Hoffman, entitled "Intrinsic resputtering–theory and experiment", published in *J. Vac. Sci. Technol.* A8 (5) Sep./Oct. 1990, pp. 3707–3712.

Article by A.H. Perera and J.P. Krusius, entitled "Suppression of lateral silicide formation in submicron TiSi$_2$ ohmic contacts to heavily doped p–type silicon", published *Appl. Phys. Lett.* 57 (14), Oct. 1990, pp. 1410–1412.

Article by N. Parekh, H. Roede, A.A. Bos, A.G.M. Jonkers and R. Verhaar, entitled "Characterization and implementation of self–aligned TiSi$_2$ in submicrometer CMOS Technology", published in *IEEE Transactions on Electron Devices*, vol. 36, No. 1, Jan. 1991.

Article by C. Lu, J. Sung, R. Liu, N. Tsai, R. Singh, S. Hillenius and H. Kirsch, entitled "Process limitation and device design tradeoffs of self–aligned TiSi$_2$ junction formation in submicrometer CMOS devices", published in *IEEE Transactions on Electron Devices*, vol. 38, No. 2, Feb. 1991.

Article by I. Kondo, T. Yoneyama, K. Kondo and O. Takenaka, entitled "Effects of different pretreatments on the surface structure of silicon and the adhesion of metal films", published in *J. Vac. Sci. Technol.*, A 10 (5), Sep./Oct. 1992, pp. 3166–3169.

*Primary Examiner*—John Niebling
*Assistant Examiner*—C. Everhart
*Attorney, Agent, or Firm*—Gerald M. Fisher

[57] ABSTRACT

A method for making an improved metal silicide layer on a silicon substrate by plasma bombardment of the substrate with Ne ions to remove the native oxide without damage or significant implantation of Ne atoms into said silicon, depositing a metal layer over the Ne etched surface and then rapidly thermally causing the metal layer to react with the underlying silicon.

8 Claims, 5 Drawing Sheets

PLASMA ETCH PROCESS AND TISI$_x$ LAYERS MADE USING THE PROCESS

FIELD OF THE INVENTION

The present invention relates to the process for manufacturing TiSi$_x$ and the improved titanium silicide (TiSi$_x$) interconnects for semiconductor integrated circuits made by the process and, to plasma processes for ultra high purity etch cleaning.

BACKGROUND OF THE INVENTION

Ion bombardment of surfaces is an important aspect of plasma etching, reactive ion etching, and sputter deposition. Ion bombardment also is an important part of several analytical techniques such as secondary ion mass spectrometry (SIMS), low energy ion scattering spectroscopy (LEIS), and Auger electron spectrometry (AES). AES employs low energy inert gas ions for physical sputtering to obtain erosion to support depth profiling. Although these are important applications, the ion induced surface chemistry and alteration of near surface chemical, physical and electronic characteristics are very complex and remain poorly understood processes. As a result, most commercial plasma assisted etching processes are empirical developments.

Plasmas are partially ionized quasi-neutral gases. They can be created in a vacuum chamber by applying a high enough electric field to ionize the gases. The power source may be a DC electric field, inductive RF coil, microwaves or a capacitively coupled RF electric field. Electrons have small mass relative to other particles so most of the energy gained in these systems is initially absorbed by the electrons. These high energy electrons collide with other particles, ionize the gas and sustain the plasma. The typical ionizing potential is high so that the majority of molecules and atoms stay neutral. Eventually a DC potential will build up between a plasma and any dielectric surface nearby, preventing any further imbalance.

In general, semiconductor processing plasmas are in a state of thermal non-equilibrium and are affected by the following:

(a) Power—By increasing power absorbed the sheath potential is increased as well as the number of ions produced. Any wafer within the plasma will experience induced temperature increases from increased ion energy bombardment as well as increased ion flux. Obviously, more damage can be done to the substrate at higher powers.

(b) Pressure—At higher pressures, more gas molecules are available which is generally believed to result in higher ion flux. While surface damage is expected with heavy ions, it has also been documented with light ions.

(c) Device configuration—Parameters such as chamber geometry including positioning of the substrate, magnet configuration, chamber materials and ion density uniformity will affect the etching process.

It is believed that etching rates of materials by various etchant gases has to do with the ability of the reactive gas molecule to penetrate into the surface being etched and to break the subsurface bond or lower the binding energy for the surface atoms and to replace that bond by bonding itself to the subsurface atoms such that the released product is volatile at the temperature of etching. It is believed that when an energetic ion strikes a solid, it transfers its energy to near surface atoms through a series of elastic collisions and electronic and vibrational processes. Collisional cascade effects can produce ion implantation, crystalline damage, ion mixing and physical sputtering. These effects can also result from low energy ion bombardment. Ion mixing is the process under which target atoms are relocated by ion impact, which process is broken up by recoil and cascade contributions. It is believed that mixing processes may be important in enhancing volatile product formation. This is distinct from sputtering in which near surface atoms receive enough momentum transfer perpendicular to the surface to overcome the surface potential barrier and thereby escape into the vacuum.

Two types of equipment are being most frequently used for plasma etching. One type of such apparatus employs a resonant cavity excited by RF fields to induce and sustain the plasma. These are relatively simple devices but have the difficulty that the plasma density and ion energy cannot be separately controlled and accordingly high ion energies cannot be curtailed in high power requirement situations. The conventional resonant cavity RF field, inductive or capacitively coupled are characterized by low electron density and high plasma potential. Another type of plasma producing apparatus employs a remote microwave resonant cavity to produce plasma which is flowed out of the cavity to a removed reaction area. This is called a downstream microwave plasma. Downstream microwave plasma is characterized by low electron density, low plasma potential, and high plasma pressure. Electron Cyclotron Resonance (ECR) microwave plasma apparatus are downstream plasma devices which recently have become more popular for etching application. The ECR apparatus can provide low pressure, high ion density at low ion energy and the ion energy can be controlled by substrate bias and the plasma potential is also low.

An electron in motion in a magnetic field is acted upon by the field to produce a force at right angles to the direction of motion of the electron. As a result, an electron entering a fixed magnetic field will follow a curved path. The radius of curvature is an inverse function of the intensity of the magnetic field. The frequency of electron rotation, w, is expressed as $w=2.8\times10^6$ B cycles/sec where B is in gauss. This is known as the electron cyclotron resonance frequency. Standard ECR plasma generators employ a magnetic field of 875 gauss and the corresponding cyclotron frequency of 2.45 GHz.

In recent years, the demands for reducing line widths and increasing device density in integrated circuits has forced the industry towards a manufacturing device called the integrated cluster tool. The integrated cluster tool is a multichamber vacuum system, in which the working chambers are arranged around a central transfer chamber and in which each working chamber is separated from the central transfer chamber by a gate valve forming a vacuum lock. During operation, a semiconductor wafer can be processed in one of the working chambers, while the remainder of the working chambers of the cluster apparatus are isolated from the environment of all of the other working chambers. After a wafer treatment is completed in a particular working chamber, the wafer is able to be automatically passed to the transfer chamber through a double gate valve and then automatically passed through the cluster tool to a subsequent working chamber through another double gate valve. This integrated cluster tool permits a plurality of various vacuum working chambers to be "clustered" around the central transfer chamber and permits the processing of a wafer through many of its most demanding processes without any requirement for the wafer to be passed out of vacuum or back into ambient air. It has been proven that it is impractical and almost impossible, to control the particulate count in a clean room to the tolerances demanded by the active device density of modern integrated circuits. Because of the increasing importance of cluster tools, it is becoming commercially important to decrease the time required for each process step on a wafer. In the past, many wafers were processed simultaneously in large furnaces. Because of the high vacuum requirements and mechanical transfer requirements, a cluster tool working module generally processes only one wafer at a time. Although duplicate identical modules can be clustered around a transfer chamber, it is seen that the cluster tool device is essentially a serial processing system and that the process time of each step will have a direct affect on the overall throughput rate.

Modern large scale integrated circuits are using the so called self-aligned silicide (salicide) structure for increased conductivity of source-drain and polysilicon interconnects. In this process a metal film is deposited on a silicon wafer and the coated wafer is reacted thermally so that the metal reacts with the underlying silicon to form a silicide. The metal and silicon combine chemically together and there is a considerable degree of silicon diffusion resulting in a layer of the compound (metal)$Si_x$ called a silicide. Usually all the metal is not consumed by the reaction. The unreacted metal is then etched away leaving a layer of silicide. If selective patterns are used to lay down the metal, the gate and source drains remain with a top layer of silicide. Several metal silicides are known including $MoSi_x$ and $TiSi_x$. Titanium has been shown to the most promising metal for this process. Titanium reacts with silicon and or polysilicon in the temperature range 600°–700° C. to form titanium silicide, $TiSi_x$.

The effect of an interface of native oxide, i.e., $SiO_2$, between the titanium and the silicon at the time of thermal reaction has significant detrimental effects on smoothness and uniformity of the reaction product silicide. Prior to metal deposition for silicide manufacturing, it is known to remove the oxide by a wet etch followed by a high voltage dry etch using an Argon plasma ion bombardment. Ar ion preclean bombardment is known to disturb/change the near surface silicon crystal structure. Several papers report both incorporation of Ar and the creation of an amorphous silicon surface layer. Kondo, J., Vac. Sci. Technology A, Vol. 10, No. 5, September/October 1992, pages 3166–3169.

Ion beam mixing is also known to improve the silicidation reaction. This is where high energy ion-implantation is employed through the metal (after metal deposition) to enable and assist mixing of the metal and silicon and subsequent silicidation in the underlayer even though an interfacial oxide layer is present. All of these prior approaches have serious problems.

The disadvantages of the prior art include the following. 1. Wet chemistry may not be able to clean high aspect ratio contact openings. 2. Wet chemistry is not compatible with cluster tools. 3. Wet chemistry is expensive and a potential environmental concern. 4. High-voltage sputtering with heavy noble gas ions such as Ar is a source of device damage. 5. Ion-beam mixing is a high-dose implantation process, and as such expensive and time consuming. 6. Noble gas ions, such as Ar and Xe, which are always implanted during sputtering tend to inhibit the subsequent Ti silicidation reaction. 7. $O_2$ is always trapped in the Si surface from native oxide knock-on, and is in general, at a higher concentration near the surface, after the surface has been bombarded with Ar and other more massive noble gas ions. 8. Amorphosizing of the silicon surface.

SUMMARY OF THE INVENTION

We have discovered an improved process for making low sheet resistance $TiSi_x$ interconnects on an integrated circuit using bombardment from a low bias plasma potential excited neon (Ne) to remove native interface oxides from silicon prior to metallization with titanium followed by subsequent thermal reaction of the Ti and Si.

It is an object to provide an improved process to make low resistance $TiSi_x$ interconnects on $n^+$ or $p^+$ silicon.

It is a further object to provide an improved ECR microwave plasma process for low temperature, rapid ECR plasma cleaning of silicon oxide without substantial amorphosizing of underlying silicon.

It is a further object to provide a Ne preclean process which is fast enough to support commercial production in an integrated cluster tool.

It is a still further object to provide a pre-etch process for $TiSi_2$ silicidation which has a large process window, i.e. independent of bias voltage, with respect to resistivity of the resultant $TiSi_2$.

DETAILED DESCRIPTION OF THE INVENTION

Figure 1:
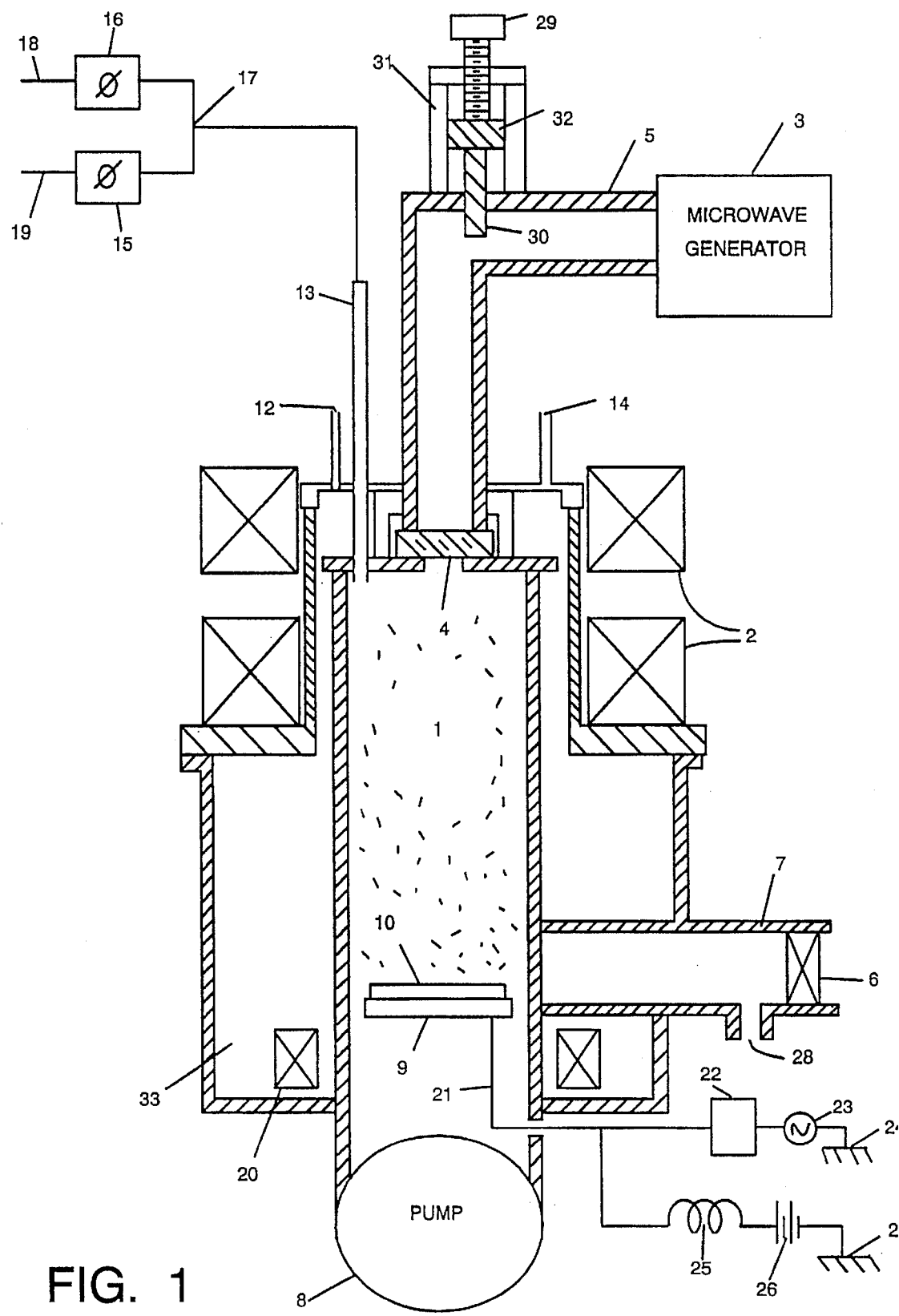
FIG. 1 is the schematic of an ECR plasma apparatus used in the inventive process.

With references to FIG. 1, there is shown a schematic diagram of an ECR plasma chamber device used in our inventive processes. The ECR provides a low pressure, high density electron, low sheath potential plasma. Electron cyclotron resonance is induced in chamber 1 by the imposition of microwave at the proper cyclotron resonance frequency from RF generator 3 via waveguide 5, past tuner 31 where the microwaves are introduced into the chamber through microwave dielectric window 4. The magnetic field from magnet 2 causes the electrons in the gases in chamber 1 to rotate at the same frequency as the microwaves such that the electrons are very quickly able to absorb the energy from the microwaves. One magnet coil 2 is shown for illustration purposes but more than one magnetic coil may be employed. Excited electrons violently impact molecules of any gas in the chamber and if conditions of pressure and power are correct, many gases will become ionized, producing a quasi-neutral plasma wherein some molecules are ionized by having their electrons knocked off and other molecules are slightly energized while remaining uncharged. The gases for sustaining the plasma and for supporting the various reactions which take place in the chamber 1 are introduced through tubes 13 into the chamber. Surrounding the chamber 1 is an annular fluid chamber 33 for cooling the chamber 1. Tubes 12 and 14 carry the coolant fluid in and out of the coolant chambers. The gas input line 13 is shown connected to a mixing "T", 17, which is coupled to several mass flow controllers 16 and 15 connected in parallel for controlling the flow rate from gas sources connected to input lines 18 and 19. The wafer 10 is shown mounted to a substrate holder 9, which may have coolant and heating conduits (not shown), both of which are mounted in the plasma column. The axial position of the substrate holder 9, relative to the plasma, is adjustable. Chamber 1 spacer rings are available for empirical adjustment for each gas employed or holder adjustments can be provided. Occasionally, a field focussing magnet 20 is mounted beneath the substrate holder 9 to shape the magnet field lines in an effort to make the ion flux density uniform across the chamber diameter in the treatment area. Shown connected to the bottom of the chamber 1 is a large capacity high vacuum pump 8. Also shown connected to the substrate holder via electrical connector 21 are electrical circuits for biasing the wafer 10. An RF bias generator 23 and an RF matching network are connected in parallel with a DC bias circuit containing an inductor 25 and a DC potential source 26. Also shown is the interconnecting transfer chamber 7 connected to an external cluster tool. The transfer chamber 7 contains a pair of vacuum gate valves 30 and 6 for separating the cluster tool from the ECR plasma chamber 1. All wafers 10 are introduced and removed from the chamber 1 by a transfer arm from the external cluster tool (not shown) which passes through the pair of gate valves, 30 and 6.

Figure 3:
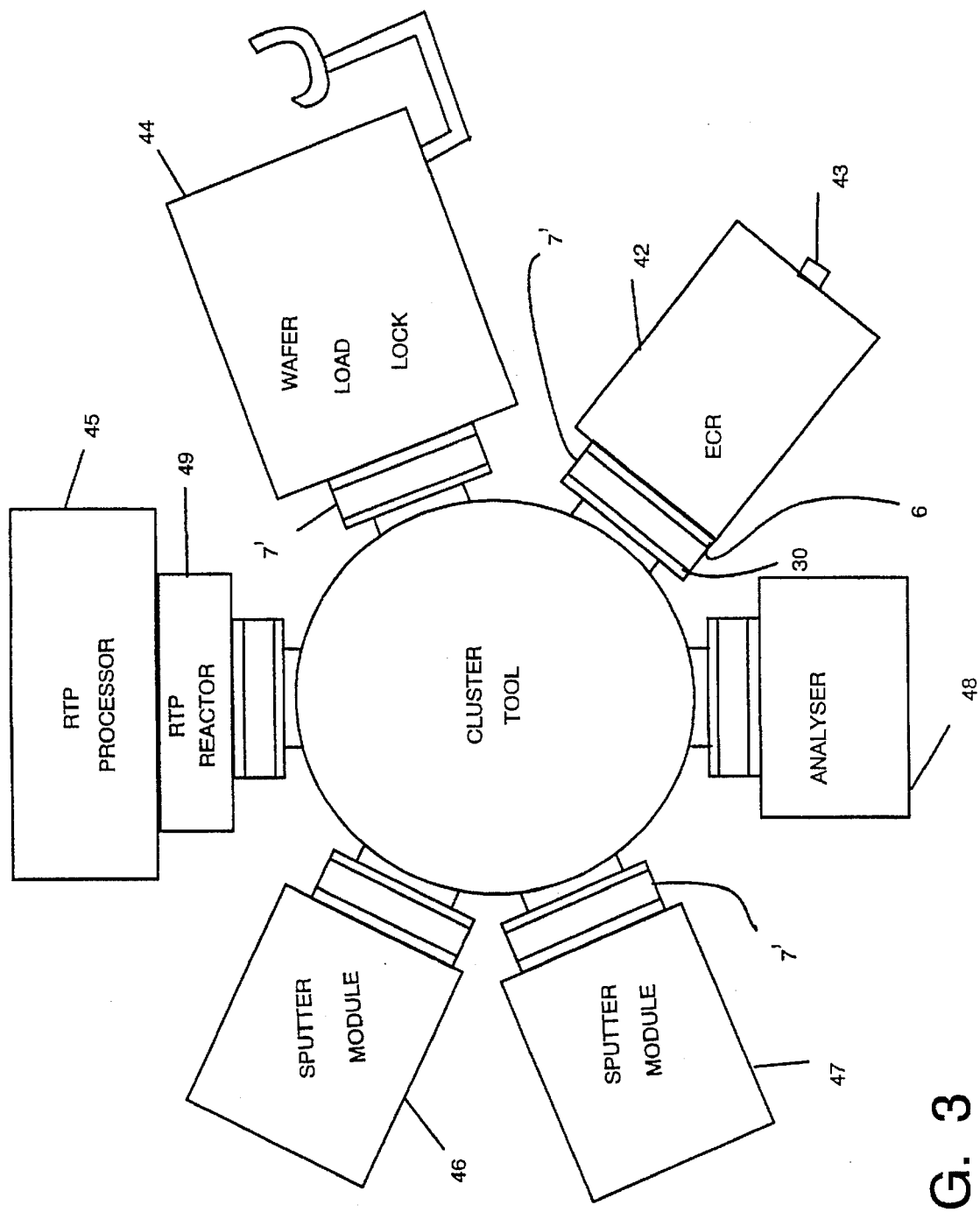
FIG. 3 is typical cluster tool diagram.

With reference to FIG. 3, the ECR 42 is shown connected to a modern cluster tool 41 for passing wafers back and forth for processing. Shown connected to the cluster tool through a dual gate valve 7' are other modules such as a rapid thermal processor (RTP) reactor 49, connected to a RTP processor 45 and RTP gas box 50. Also connected to the cluster tool through a dual gate valve 7' is a pair of sputter modules 46 and 47 that are used to deposit metallization for integrated circuit current paths. In the research environment we have also connected an analytical module 48 including an x-ray photoelectron spectrometer (XPS) and a static secondary ion mass spectrometer (SSIMS). The limitation upon the number of module that can be connected to the periphery of the current models of cluster tools is determined by the diameter of the aperture required for the dual gate valve 7' and the size of the periphery of the cluster tool. The gate valve diameter is determined by the diameter of the wafers to be processed.

We have used a material for the chamber window 4 which is not etchable by our plasma gases, so as to eliminate introduction of oxygen in the chamber during etch to eliminate as many sources of oxygen as possible from the reactor during oxide etch. Flame sprayed alumina $AlO_x(OH)_y$ on a quartz window disk precludes the release of oxygen and passes the RF without excessive overheating. Alternatively, the window could be passivated.

Figure 2:
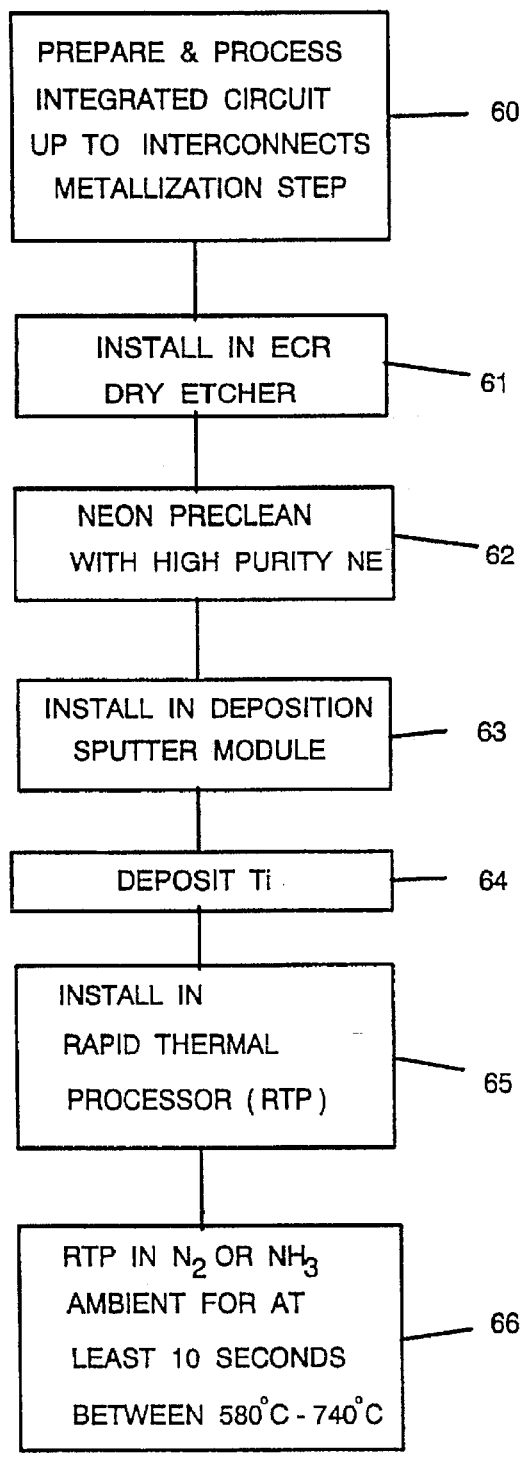
FIG. 2 is the process flow diagram of the invention.

With reference to FIG. 2, in step 60, an integrated circuit wafer is partially manufactured by processes known in the art which are not part of this invention up to the metallization step. This normally implies that active circuits, i.e., for CMOS technology, the gates, drains and sources, have been defined and that some of the circuit elements are ready to be interconnected. Because of the high density of active elements and the narrow interconnections now required, the process which provides the lowest sheet resistance is being sought. It is known that silicides formed by rapid thermal processors, and especially titanium silicide provide the most promise. However, the known process employing a wet etch and then a 600 volt Argon or Xenon ion sputtering as a preclean, is known to implant the noble gas ion. We have shown that the implanted heavy noble gas ion inhibits the Ti silicidation reaction and that the resultant $TiSi_x$ is thinner (and higher resisitivity) for the same conditions. Furthermore, oxygen, from the native oxide or otherwise near the surface is also known to be trapped in the silicon surface when the large noble gas ions such as Ar and Xe bombard the surface. Such $O_2$ is in general at higher concentrations near the surface.

As shown in FIG. 2, we install the integrated circuit in an ECR etcher and establish a Ne plasma for a gentle preetch with a very high purity Neon. The chamber pressure was $3-8 \times 10^{-8}$ Torr and the net microwave power was 1.0 where net microwave power equals forward power minus reflected power. We have found that at plasma sheath voltages below 200 volt, typically on the order of 10 volts to 20 volts that we quickly completely remove 1-2 nm thick native oxide and adventitious hydrocarbons from the silicon surface. However, we note in our SIMS analysis that a small amount of Ne is implanted in the Si and we see some adsorbed $O_2$ on the surface. However, little or no $O_2$ is implanted into the Si. Next, this cleaned substrate is transported to the sputter module, step 63 and the nominal thickness of titanium of 10 to 60 nm is sputter deposited in step 64. Next, the wafer is installed in the RTP module, step 65 and rapidly annealed to between 580° C.–740° C. for at least ten (10) seconds in an $N_2$ or $NH_3$ ambient.

The above annealing step forms a metallic bilayer of $TiN_xO_y$ on $TiSi_2$ at the interface. The former layer of $TiN_xO_y$ can act as a stop layer or a diffusion barrier layer to a subsequent Al overcoat.

We have determined that the purity of the Ne used in the preclean is critical to the improved sheet resistance especially with respect to the concentration of other noble gas, or permanent gases $N_2$, $O_2$, or $H_2O$ vapor. We have obtained our best results with 99.999% Neon, in which $N_2$ and $O_2$ are less than 1.0 ppm and Argon and Krypton are less than 0.1 ppm and $H_2O$ less than 0.5 ppm.

Figure 4:
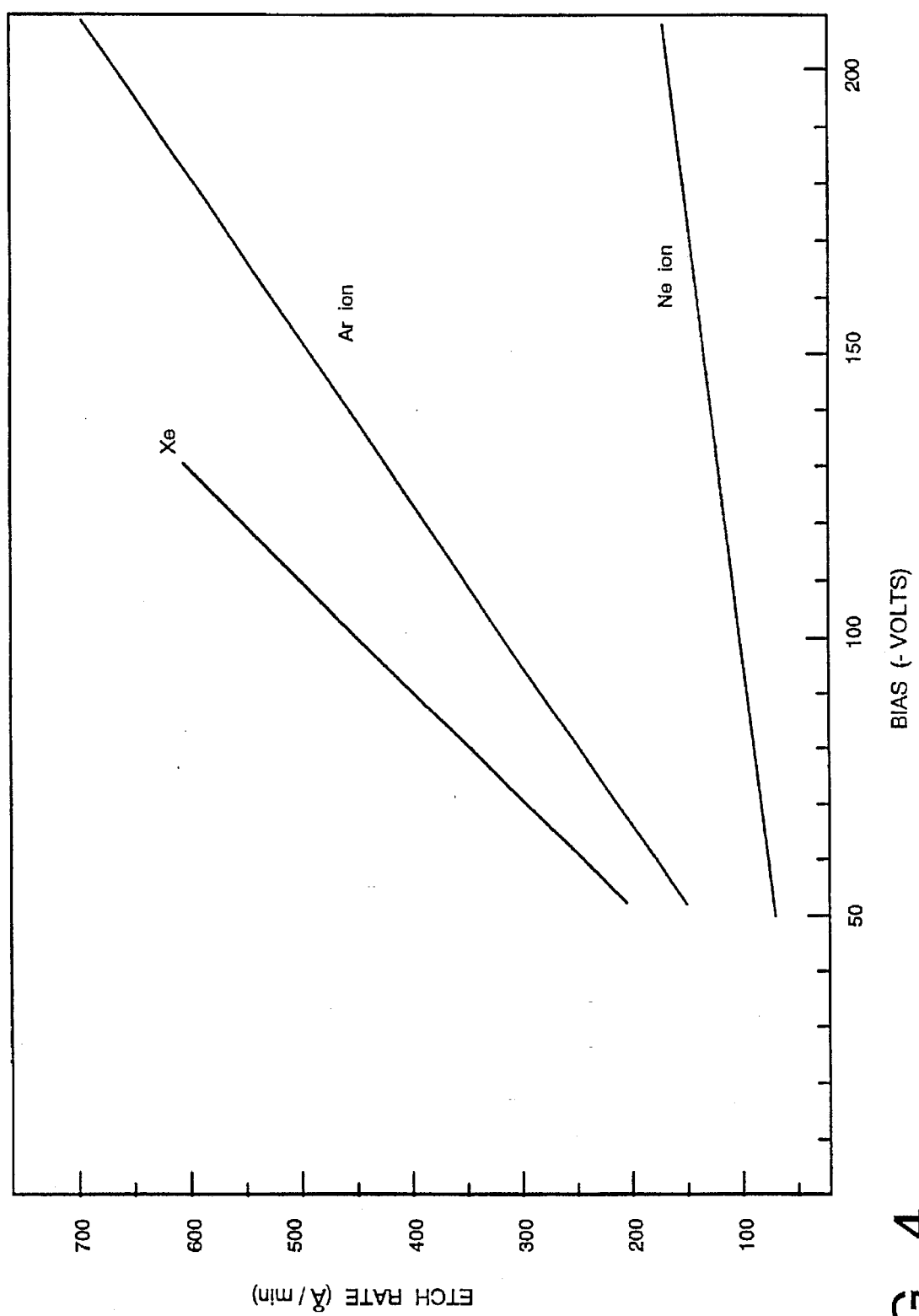
FIG. 4 is a graph of Etch Rate versus bias potential for Xe, Ar and Ne in ECR plasma apparatus.

With respect to FIG. 4, our measurements show the $SiO_2$ etch rate versus Bias voltage for noble gas ions including Neon in our preclean etcher. In view of the fact that the ordinary native oxide is 1–2 nm thick, at voltages as low as –50 v, our process will remove the native $SiO_2$ in less that 1 min.

Figure 5:
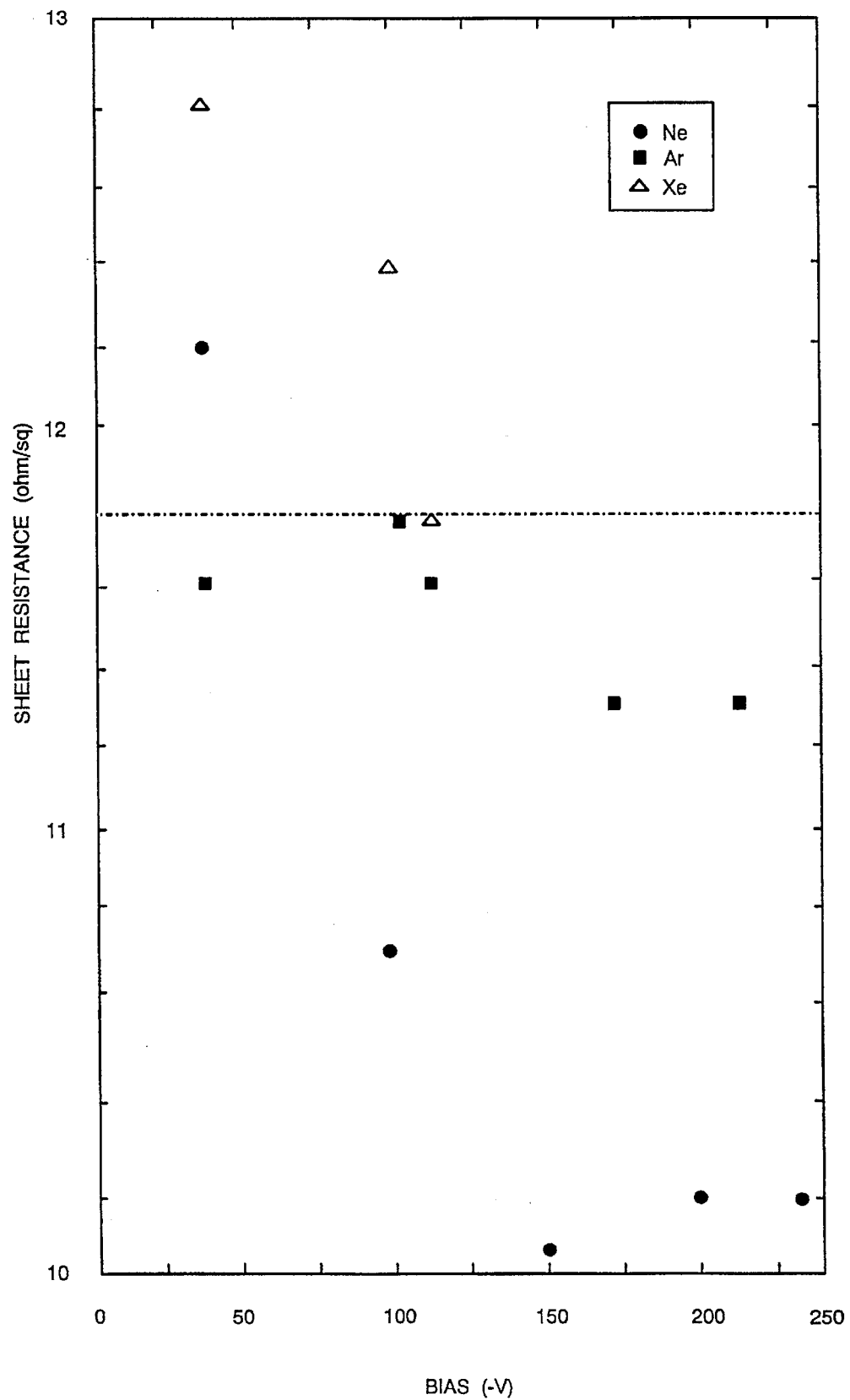
FIG. 5 is a chart of $TiSi_x$ sheet resistance as a function of preclean plasma etch substrate bias for Xe, Ar and Ne.

With respect to FIG. 5 we show comparative sheet resistance for $TiSi_2$ made with different nobel gas used for the ECR preclean processes.

FIG. 5 clearly demonstrates that the process window using the Neon preclean is extremely forgiving, i.e. the sheet resistance does not vary as a function of the bias voltage. Accordingly, not only is the sheet resistance lower than that obtainable by the other noble gases but it is also repeatable over a broad range of sheath voltage.

One important aspect of metallization of a semiconductor is the ability to clean native oxides in the bottom of high aspect ratio VIAs. A lower mass ions has a higher probability of reaching the bottom of a VIA during etch. This invention also promotes less redeposition onto a contact opening and causes less substrate damage by employing lower energy than possible using Ar, Xe or Kr. Also, for the same process parameters and the same amount of deposited Ti, the Ne precleaned surface provides an increased proportion of $TiSi_2$ because of an enhanced thermal budget during the reaction between the Ti and Si. This results in the thicker and lower resistance $TiSi_2$ layer for the same reaction time.

A typical process for making improved VIA interconnects according to this invention on a partially processed semiconductor integrated circuit wafer which has been processed up to first level metallization comprises:
  (a) inserting said wafer into a vacuum chamber;
  (b) exciting in said vacuum chamber an ECR neon plasma and bombarding said wafer with low energy neon ions on the order of 50–250 volts from said plasma to volatilize native oxide without embedding heavy noble gas ions in said wafer;
  (c) stopping said bombardment when essentially all native oxide on said substrate is volatilized;

(d) sputter depositing a titanium layer on said wafer, said titanium layer to become the metal reaction component of a silicide first level metallization;

(e) rapidly annealing said titanium layer at a temperature high enough to react said titanium and the neon plasma cleaned silicon underlying and in direct contact with said titanium, said annealing be carried out in a $N_2$ or $NH_3$, environment so that a TiN or $TiO_xN_y$ layer forms above a $TiSi_2$ layer;

(f) creating a first metallization mask for patterning said first layer metal interconnects by applying resist, photographically exposing said resist and developing said resist;

(g) dry etching through said first metallization mask to create first interconnects;

(h) depositing on said annealed layer a field oxide for isolating said metallization;

(i) planarizing said field oxide;

(j) creating a VIA pattern mask on top of said field oxide by applying resist, photographically exposing said resist and developing said resist;

(k) dry etching said field oxide through said VIA pattern mask to create VIA holes, said etching proceeds through said field oxide and stops on said TiN or $TiO_xN_y$ layer;

(l) filling said VIA holes with aluminum by sputtering aluminum into said VIA holes without removing said TiN or $TiO_xN_y$ layer atop said $TiSi_2$ whereby said TiN or $TiO_xN_y$ comprises an Al diffusion barrier.

Although, our preferred process retains vacuum between cleaning and deposition steps as made convenient in a cluster tool, it is not absolutely required to vacuum integrate this process to obtain good silicides. A small amount of non-implanted, i.e., absorbed oxygen, does not necessarily preclude good low resistivity silicidation using our Neon etch preclean.

It is not our intention to limit our invention to the preferred embodiment but rather the scope of our invention should be construed in view of our claims. With this in mind,

We claim:

1. A method for making an improved metal silicide layer on a silicon substrate having a native oxide layer thereon comprising, installing said silicon substrate in a vacuum chamber; exciting in said vacuum chamber a downstream neon microwave plasma employing an electron cyclotron resonance apparatus and flowing said plasma towards said substrate in said plasma chamber and bombarding said substrate with neon ions from said plasma;

stopping said bombardment when essentially all native oxide on said substrate is volatized;

depositing a metal layer on said substrate;

annealing said metal layer at a temperature high enough to cause said metal and said silicon underlying said metal to chemically react to form a metal silicide.

2. The process of claim 1 wherein said neon plasma is generated in a neon gas having at least 99% neon by weight.

3. The process of claim 2 wherein said metal layer is titanium and wherein said silicide is $TiSi_2$.

4. The process of claim 3 wherein said metal layer is deposited by a sputter deposition process.

5. The process of claim 3 wherein said metal layer is annealed in a rapid thermal process chamber in a $N_2$ or $NH_3$ environment and wherein a TiN or $TiO_xN_y$ layer is formed at the top surface of said metal silicide.

6. The process of claim 5 wherein said anneal is carried out between 580° C. to 740° C. for at least ten seconds.

7. A method for making improved via interconnects on a partially processed semiconductor integrated circuit wafer which has been processed up to first level metallization comprising;

(a) inserting said wafer into a vacuum chamber;

(b) exciting in said vacuum chamber an ECR neon plasma and bombarding said wafer with low energy neon ions on the order of 50–250 volts from said plasma to volatilize native oxide without embedding heavy noble gas ions in said wafer;

(c) stopping said bombardment when essentially all native oxide on said substrate is volatized;

(d) sputter depositing a titanium layer on said wafer, said titanium layer to become the metal reaction component of a silicide first level metallization;

(e) annealing said titanium layer at a temperature high enough to react said titanium and the neon plasma cleaned silicon underlying and in direct contact with said titanium, said annealing carried out in a $N_2$ or $NH_3$ environment so that a TiN or $TiO_xN_y$ layer forms above a $TiSi_2$ layer;

(f) creating first metallization mask for patterning said first layer metal interconnects by applying resist, photographically exposing said resist and developing said resist;

(g) dry etching through said first metallization mask to create first interconnects;

(h) depositing on said annealed layer a field oxide for isolating said metallization;

(j) planarizing said field oxide;

(k) creating a via pattern mask on top of said field oxide by applying resist, photographically exposing said resist and developing said resist;

(l) dry etching said field oxide through said via pattern mask to create via holes, said etching proceeds through said field oxide and stops in said TiN or $TiO_xN_y$ layer;

(m) filling said via holes with aluminum by sputtering aluminum into said via holes without removing said Ti N or $TiO_xN_y$ layer atop said $TiSi_2$ whereby said TiN or $TiO_xN_y$ comprises an Al diffusion barrier.

8. An integrated circuit on a silicon wafer having low sheet resistance $TiSi_2$ interconnects, said $TiSi_2$ interconnects having a silicon-$TiSi_2$ interface, and a TiN or $TiO_xN_y$ diffusion barrier between said $TiSi_2$ interconnects and aluminum in via holes, said integrated circuit being made by the process of claim 7, said $TiSi_2$ interconnects having a trace of Ne trapped in said silicon-$TiSi_2$ interface, said $TiSi_2$ interconnects having a sheet resistance less than 11 ohms/square.

* * * * *